United States Patent [19]

Virkus et al.

[11] Patent Number: 5,019,525
[45] Date of Patent: May 28, 1991

[54] METHOD FOR FORMING A HORIZONTAL SELF-ALIGNED TRANSISTOR

[75] Inventors: Robert L. Virkus, Garland; David B. Spratt; Eldon J. Zorinsky, both of Plano, all of Tex.

[73] Assignee: Texas Instruments Incorporated, Dallas, Tex.

[21] Appl. No.: 548,177

[22] Filed: Jul. 5, 1990

Related U.S. Application Data

[60] Division of Ser. No. 300,144, Jan. 23, 1989, abandoned, which is a continuation of Ser. No. 86,466, Aug. 18, 1987, abandoned.

[51] Int. Cl.⁵ ............................................. H01L 21/265
[52] U.S. Cl. ............................................. 437/32; 437/157; 437/158; 437/63; 148/DIG. 150
[58] Field of Search ............................. 437/32, 917; 148/DIG. 150, DIG. 96, DIG. 97; 357/23.7, 35

[56] References Cited

U.S. PATENT DOCUMENTS

| | | | |
|---|---|---|---|
| 4,050,965 | 9/1977 | Ipri et al. | 437/84 |
| 4,277,883 | 7/1981 | Kaplan | 148/DIG. 150 |
| 4,447,823 | 5/1984 | Maeguchi et al. | 357/23.7 |
| 4,545,113 | 10/1985 | Vora | 437/32 |
| 4,743,565 | 5/1988 | Goth et al. | 437/32 |
| 4,897,698 | 1/1990 | Zorinsky et al. | 357/35 |

FOREIGN PATENT DOCUMENTS 0137992 4/1985 European Pat. Off. .............. 357/35

Primary Examiner—Brian E. Hearn
Assistant Examiner—Michael Trinh
Attorney, Agent, or Firm—Melvin Sharp; James T. Comfort; N. Rhys Merrett

[57] ABSTRACT

A method for forming a self-aligned horizontal transistor includes the step of first defining a narrow base contact on an isolated N-tank (10) to define a first reference edge (41). A layer of sidewall oxide (40) is then disposed on the vertical wall of the base contact (34) to define a second reference edge (42). An emitter well (44) and a collector well (46) are then defined on either side of the contact with the vertical wall of the emitter well (44) aligned with the reference edge (42). A dopant material is then disposed adjacent the reference edge (42) and the dopant diffused into the substrate from a lateral direction to form a P-type base region (58) with a graded impurity profile. N-doped regions (64) and (66) are then formed in the emitter and collector wells to form the emitter and collector of the transistor.

15 Claims, 2 Drawing Sheets

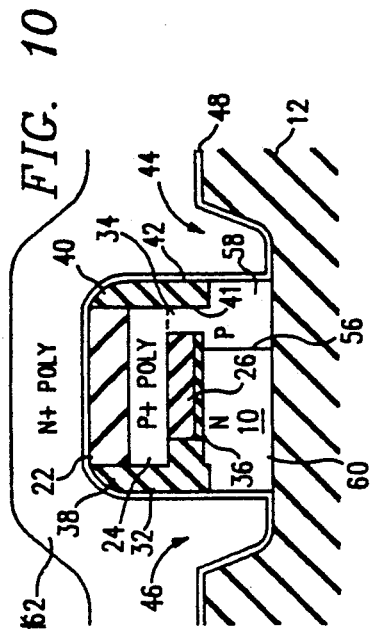
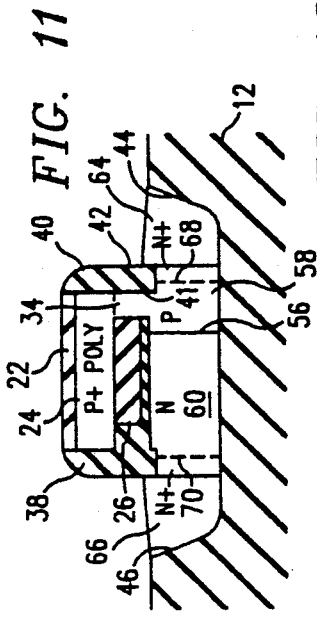
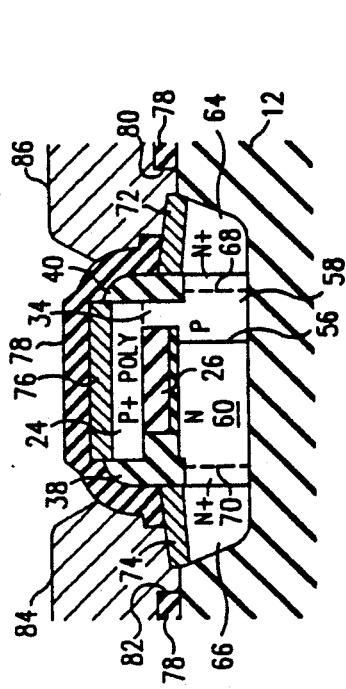
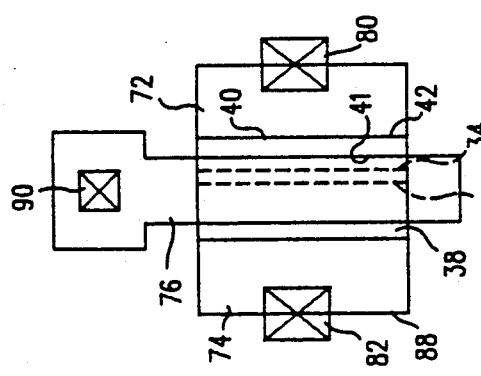
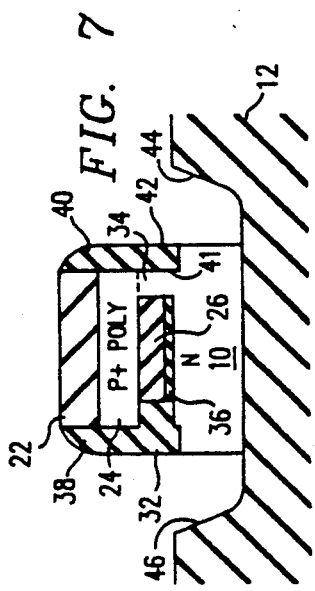
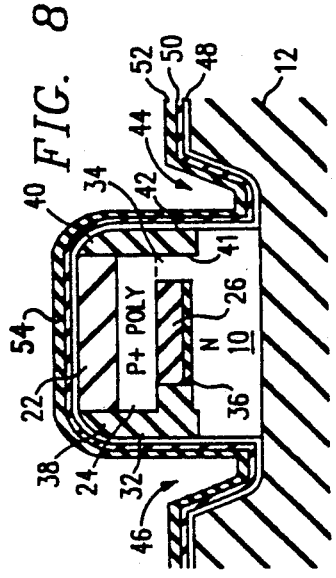

METHOD FOR FORMING A HORIZONTAL SELF-ALIGNED TRANSISTOR

This is a division, of application Ser. No. 300,144, filed Jan. 23, 1989, now abandoned which is continuation of U.S. patent application Ser. No. 086,466, filed Aug. 18, 1987, now abandoned.

TECHNICAL FIELD OF THE INVENTION

The present invention pertains in general to fabrication techniques for bipolar transistors and more particularly, to a fabrication technique for a horizontal transistor with vertical junctions.

CROSS REFERENCE TO RELATED APPLICATION

This application is related to U.S. patent application Ser. No. 806,258, filed Dec. 6, 1985 and U.S. patent application Ser. No. 810,001, filed 12-17-85.

BACKGROUND OF THE INVENTION

Lateral self-aligned transistors have been utilized in the semiconductor industry to provide improved bipolar integrated circuits. This type of structure allows for a more densely packed circuit without resorting to a vertically fabricated device utilizing, for example, the conventional buried collector. One disadvantage to the fabrication of lateral bipolar devices, has been the inability to utilize a top side base contact and also the doping profile of the base, collector and emitter of the transistor.

In prior art lateral NPN transistors, a uniform base doping profile has typically been utilized. This is to be compared with the graded base dopant profile for a vertical transistor. The graded base dopant profile has operational advantages over the uniform base in that it allows for an optimized design with enhanced carrier velocity. The uniform base of prior art lateral devices results from the construction method which normally requires the emitter and the collector to be diffused or implanted into a previously formed epitaxial base layer, which has a uniform dopant distribution.

An additional disadvantage with respect to previously fabricated lateral NPN transistors is the use of a buried conductor. Typically, a lateral transistor utilizes a buried P+ layer extending under the transistor to provide the base contact, with an external contact point provided on the periphery of the transistor. In addition to the fabrication problems associated with this type of structure, there is also an associated vertical parasitic transistor. Additionally, the contact is made underneath the transistor to the buried contact as opposed to a top side contact. It is more desirable to have a top side contact.

In view of the above disadvantages, there exists a need for a lateral NPN transistor which has both a graded junction and a top side base contact in addition to increased isolation to prevent the existence of parasitic transistors.

SUMMARY OF THE INVENTION

The invention disclosed and claimed herein comprises a method for forming a horizontal transistor. An island of semiconductor material forms an insulator utilizing a silicon on insulator technique. A stacked base structure is formed over the island to define a base region with a collector and emitter defined on either side thereof. The stacked structure provides a layer of doped poly over an insulating layer. A portion of the insulation layer is undercut on the emitter side and filled with undoped poly. A sidewall oxide is formed on either side of the stacked structure to a predetermined thickness. Trenches are etched on the emitter and collector side utilizing the outermost surface of the sidewall oxide as a self-aligned edge. The trenches extend from the surface of the semiconductor island down to the bottom surface thereof. Impurities are introduced into the vertical wall of the emitter trench and driven laterally into the semiconductor material to form a metallurgical junction on the opposite side of the P-doped poly filler base contact, this junction forming the base collector junction. A layer of poly is deposited in the collector and emitter trenches and doped with impurities of a type similar to the semiconductor island doping to form the emitter and collector contact.

In another embodiment of the present invention, the impurities are introduced into the vertical wall of the emitter trench by first depositing a thin layer of polycrystalline silicon over the vertical wall of the emitter trench. Impurities are then diffused into the layer of poly and then driven therefrom into the substrate material in a lateral direction.

A technical advantage is provided by the present invention in that a thin base contact can be provided on the top side of the substrate for contacting the base. A further technical advantage is provided by introducing the base impurities through the vertical wall of the emitter trench to provide both a vertical junction and a graded based open profile. A yet further technical advantage is provided by the silicon on insulated structure wherein the junctions are vertical, resulting in a more consistent base width in a vertical direction.

BRIEF DESCRIPTION OF THE DRAWINGS

For a more complete understanding of the present invention and the advantages thereof, reference is now made to the following description taken in conjunction with the accompanying Drawings in which:

FIG. 7 illustrates a cross-sectional view of the stacked structure with trenches formed on either side thereof;

FIG. 8 illustrates a cross-sectional view of the stacked structure with a doping layer of poly formed in the trenches and over the substrate;

FIG. 9 illustrates a cross-sectional view of the stacked structure after doping the base;

FIG. 10 illustrates a cross-sectional view of the stacked structure with an N+ poly layer disposed over the substrate to fill the trenches;

FIG. 11 illustrates a cross-sectional view of the horizontal transistor after a planarizing resist is utilized;

FIG. 12 illustrates a cross-sectional view of the finished device after silicided layers have been formed over the poly layers and metal contacts formed on the substrate; and FIG. 13 illustrates a top view of the bipolar transistor prior to forming the metal layer.

DETAILED DESCRIPTION OF THE INVENTION

Figure 1:
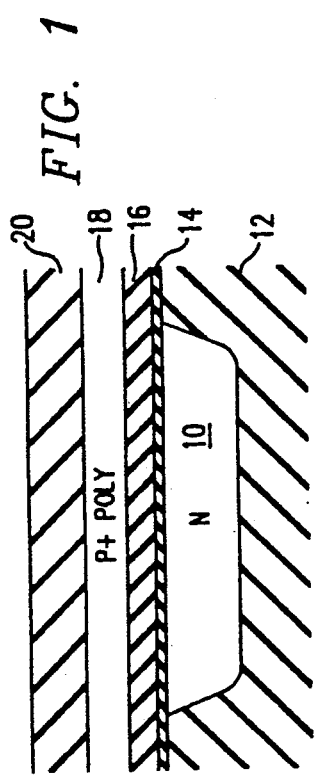
FIG. 1 illustrates the first step in the fabrication of the transistor by fabricating an N-type tank in an isolated silicon over oxide structure.

Referring now to FIG. 1, there is illustrated a cross-sectional view of an isolated N-type substrate 10 which has an oxide layer 12 disposed therearound. This substrate has an impurity concentration of approximately $1E16 cm^{-3}$ [3]. The fabrication of the this structure is illustrated in detail in U.S. patent application Ser. No. 806,258, filed Dec. 6, 1985 and entitled "Semiconductor Isolation Using Trenches and Oxidation of Anodized Silicon Sublayer," which patent application is incorporated herein by reference. The substrate has a 350 Angstroms layer of oxide 14 grown on the surface thereof. A layer of nitride 16 is deposited thereover to a thickness of approximately 2,000 Angstroms. A layer of polycrystalline silicon (poly) 18 is deposited thereover to a thickness of approximately 3500 Angstroms. The poly layer 18 is implanted with Boron to a dosage of approximately 1E15 at an energy of 50 KeV and then annealed to form a P+ layer. Thereafter, an insulating layer of oxide 20 is deposited to a thickness of approximately 4500 Angstroms. The oxide deposition utilizes a process called Tetraethoxysilane (TEOS) which etches at a faster rate than thermally grown oxide. After formation of layer 20, it is densified in steam at a temperature of 850° C. for approximately 30 minutes.

Figure 2:
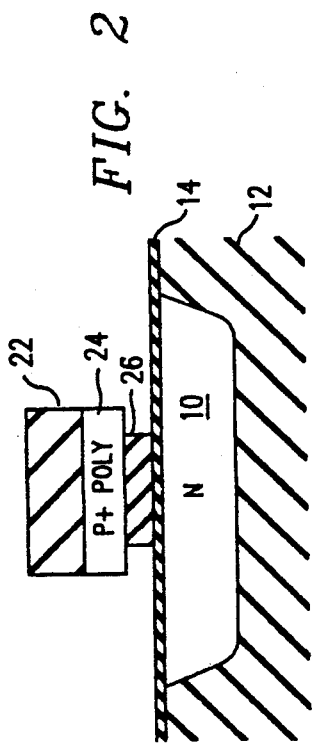
FIG. 2 illustrates the substrate with a self-aligned base stacked structure.

Referring now to FIG. 2, there is illustrated a cross-sectional view of a self-aligned base formed from the structure of FIG. 1. The structure of FIG. 1 is first patterned to define the self-aligned base (SAB) with a layer of photo resist. The SAB structure has a base side from which the base is to be formed in the substrate 10, as will be described in more detail hereinbelow, and a non-base side. The TEOS layer 20 is first etched, followed by the P+ poly layer 18 and then the nitride layer 16. The etching is stopped on the thin oxide layer 14. The photo resist is then stripped and the nitride layer 16 undercut on both sides of the SAB structure by utilizing a hot phosphoric acid etch. This results in a stacked structure with a top layer of oxide 22, an intermediate of P+ poly 24 and a layer of nitride 26, the layer of nitride 26 being undercut with respect to the oxide layer 22 and the P+ poly layer 24. As will be described in more detail hereinbelow, the P+ poly layer 24 will form part of the base contact.

Figure 3:
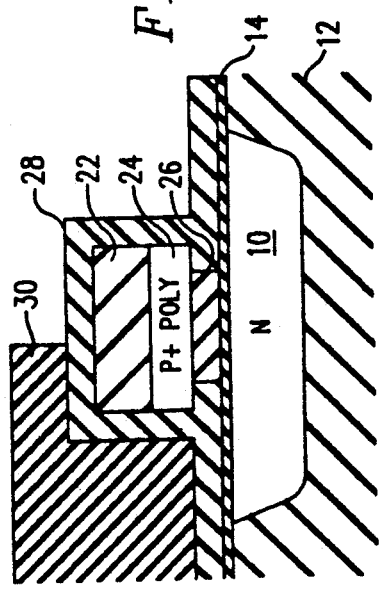
FIG. 3 illustrates the stacked structure with a layer of oxide formed thereover and patterned with a blocking mask.

A layer of TEOS is then disposed over the substrate to refill both sides of the undercut nitride layer 26 and also provide a conformal layer of TEOS 28 over the stacked structure, which layer 28 is comprised of undensified TEOS. The non-base side of the transistor structure is then patterned with a layer of resist 30 to provide a blocking mask. The resulting structure is illustrated in FIG. 3.

Figure 4:
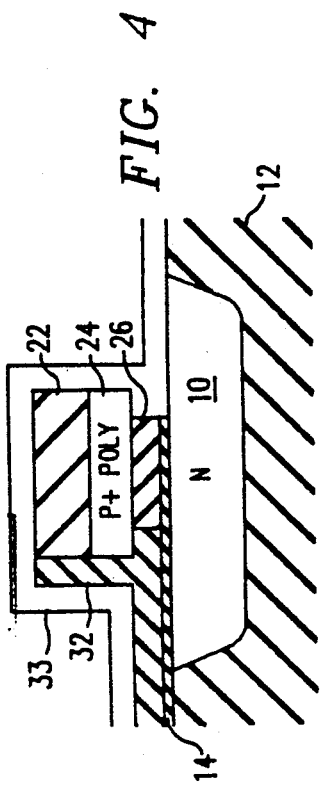
FIG. 4 illustrates a cross-sectional view of the stacked structure with a layer of poly disposed thereover.
Figure 5:
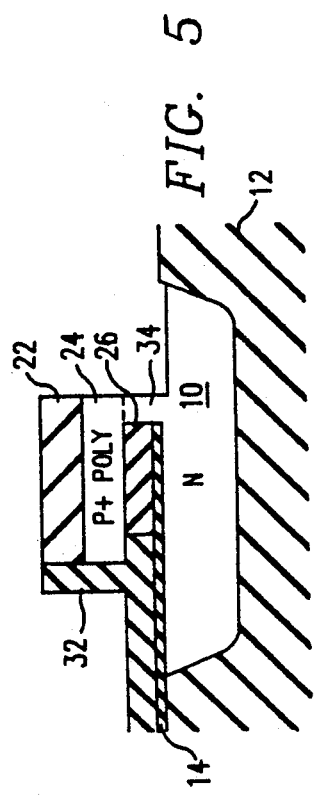
FIG. 5 illustrates a cross-sectional view of the stacked structure with the formation of a polysilicon plug.

The undensified TEOS layer 28 is then deglazed from the nonmasked portion of the stacked structure in addition to removal of the portion of the thin thermal oxide layer 14 on the base side of the transistor. The resist layer 30 is then stripped, leaving behind a layer of oxide 32 on the vertical wall of the stacked structure on the non-base side and also overlying the thermal oxide layer 14. A layer of undoped poly 33 is then deposited utilizing a low pressure chemical vapor deposition (LPCVD) technique to refill the undercut region on the base side to form the contact. The resulting structure is illustrated in FIG. 4.

After the poly layer 33 is formed, the substrate is subjected to an isotropic poly etch which etches the poly layer 33 in all directions at a constant rate. Since the thickness of the poly measured from the surface of the layer 33 to the vertical edge of the nitride layer 26 is slightly thicker at the undercut portion of the stacked structure on the base side, this will result in a refill plug 34 of undoped poly being formed in the undercut region adjacent to the nitride layer 26. This poly plug 34 provides the base contact.

After formation of the poly plug 34, the undensified TEOS layer 32 on the non-base side is deglazed to remove it. In addition, the portion of the thin thermal oxide layer 14 overlying the non-base side of the transistor is also removed, resulting in a remaining oxide layer 36 underneath the nitride layer 26. This is followed by an isotropic etch which effectively etches the surface of the N-type substrate 10 on either side of the stacked structure by approximately 600 Angstroms to remove the poly "foot." A conformal layer of TEOS is then deposited over the substrate to a thickness of approximately 3,000 Angstroms and then densified. The substrate is then subjected to an anisotropic etch to form a sidewall oxide 38 on the non-base side and a sidewall oxide layer 40 on the base side. The resulting structure is illustrated in FIG. 6.

Figure 6:
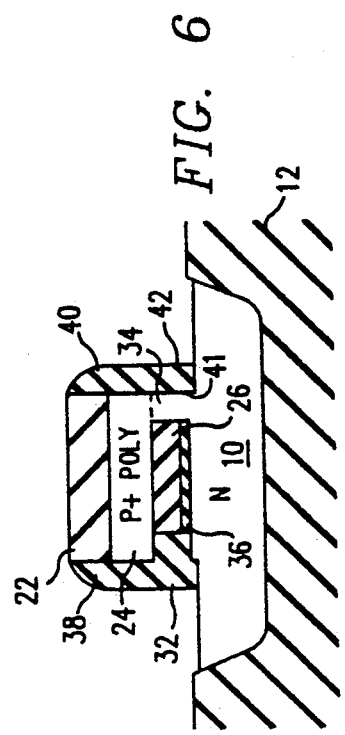
FIG. 6 illustrates a cross-sectional view of the stacked structure with a side wall oxide formed on the vertical walls of the stacked structure.

The stacked structure of FIG. 6 has two edges defined thereby. The first is an edge 41 defined by the external edge of the poly plug 34 nd the second is an edge 42 formed by the boundary between the edge 41 of the poly plug 34 and the external edge of the sidewall oxide 40. The spacing of the edge 42 from the edge 40 is defined by the thickness of the sidewall oxide layer 40. As will be described hereinbelow, this provides an important offset when defining the various junctions of the transistor.

The stacked structure illustrated in the process steps of FIGS. 1–6, can be fabricated by a number of alternate techniques. For example, a stacked structure can be formed by first forming a layer of TEOS oxide over the substrate followed by a layer of P+ poly, a layer of TEOS oxide and a layer of nitride. This is patterned and then etched such that only the uppermost layers (nitride, oxide and P+ poly) are removed without etching the lower TEOS oxide layer. A nitride cap is then formed over the three uppermost layers of nitride, TEOS oxide and P+ poly. Thereafter, the lowermost layer of TEOS is then etched first with a plasma etch followed by a wet etch to undercut the remaining P+ poly layer which is protected on the sidewalls thereof by the nitride cap, such that the poly layer is undercut. This is followed by stripping the nitride cap and then refilling the undercut portion with a poly layer.

An additional alternative, when fabricating the device and forming the sidewall oxide layers 38 and 40, is to pattern the stacked structure with a blocking mask on the non-base side to prevent undercutting of the poly layer 24 on the non-base side. Thereafter, the poly layer 34 will be prevented from forming a thicker portion on the non-base side. The poly layer after formation thereof can then be oxidized to form an oxide which will penetrate to the original silicon surface of the N-type tank 10. This eliminates the need for forming the sidewall oxide by a separate step.

Referring further to the present embodiment, the structure of FIG. 6 is etched to form an emitter well 44 and a collector well 46, as illustrated in FIG. 7. The wells 44 and 46 are formed by etching downward into the epi-substrate 10 to the surface of the isolating oxide 12. This etch is an anisotropic operation which results in the edge 42 extending vertically from the sidewall oxide layer 40 to the vertical wall of the remaining portion of the N-type tank 10, in addition to the outermost edge of the sidewall oxide 38 extending downward to the oxide region 12. Further, the thickness of the TEOS layer 22 is slightly reduced. This results in a self-aligned process for forming the vertical wall of the wells 44 and 46 proximate to the stacked structure. Although the walls of the emitter well 44 and the collector well 46 are defined as being vertical, it should be understood that a slight taper on the walls may be desirable.

After formation of the emitter well 44 and the collector well 46, a layer 48 of undoped poly is conformly deposited over the substrate to a thickness of approximately 500 Angstroms. This is followed by a deposition of a layer of nitride 50 to a thickness of approximately 400 Angstroms and depositing of a layer of TEOS 52 to a thickness of approximately 500 Angstroms. The layer of TEOS 52 is then densified in a nonoxidizing atmosphere and the base patterned with a mask defining layer of resist 54. The structure is illustrated in FIG. 8.

After forming the layer of undoped poly, the TEOS layer 52 is etched with a wet etch to remove the non-masked portion followed by stripping of the resist such that a TEOS mask layer 55 remains over the nitride layer 50. The unmasked portion of the nitride layer 50 is then etched away to uncover the underlying portion of the poly layer 48. The remaining portion of the TEOS layer 55 and the underlying nitride layer 50 forms a hard mask. The resulting structure is illustrated in FIG. 9.

After patterning of the doping layer 50 on the base side, the substrate is subjected to a doping operation which utilizes a diffusion of Boron nitride into the substrate at a temperature of approximately 700° C. for approximately thirty minutes. This results in the poly layer 48 being doped on the portion not covered by the remaining nitride layer 50 with a surface concentration of $10^{19}$–$10^{20}$ adjacent to the edge 42. It is important to note that the dopant is now disposed a predetermined distance away from the edge 41, which distance is defined by the thickness of the sidewall oxide layer 40. The substrate is then subjected to a drive step wherein the substrate is disposed at a temperature of approximately 900° C. for thirty minutes such that the dopant material is driven "laterally" into the N-tank 10. This forms a metallurgical junction 56 a predetermined distance away from the edge 42 to define a P-type base region 58 which is in contact with the N-doped poly plug 34. The junction 56 forms the collector-base junction of the transistor and is disposed away from the poly plug 34 on the collector side with an N-type collector region 60 defined on the opposite side of the junction 56. It is important to note that there is no undoped N-type silicon disposed beneath the P-type base region 58, since the original N-tank 10 was formed on the isolating oxide 12, and the emitter and collector wells 44 and 46 were etched all the way down to the surface of the oxide 12.

After the base region 58 is formed, the remaining TEOS layer 55 is deglazed and the nitride layer 50 is removed. A layer of doped N+ poly 62 is then deposited over the substrate to refill the emitter and collector wells 44 and 46 with N+ poly silicon. This structure is illustrated in FIG. 10. The N+ poly layer 62 can either be formed in a single step and down doped by $POCL_3$ with a diffusion process or, in the preferred embodiment, formed in two steps. The two-step process requires first depositing a conformal layer of poly to a thickness of 2000 Angstroms, followed by diffusion of $POCL_3$ at 850° C. for thirty to sixty minutes. This is followed by the deposition of 8000 Angstroms of poly that is doped by diffusion of $POCL_3$ at 850° C. for thirty to sixty minutes. The two-step process ensures a more uniform doping adjacent the P-type base region 58.

The layer 62 is then planarized by depositing a planarizing resist over the substrate and isotropically etching the resist and the excess poly silicon. This leaves an N+ region 64 in the emitter well 44 and an n+ region 66 in the collector well 46, which N+ regions 64 and 66 provide refill plugs. The substrate is then subjected to an emitter drive by annealing the substrate at a temperature of approximately 900° C. for thirty minutes. This drives the N+ dopant from the region 64 into the P-type region 58 forming a metallurgical junction 68 to define the extrinsic emitter between the emitter and the base and also drives the N+ impurities from the region 66 into the N-type collector region 62 to form a boundary 70 between the N+ and N-type materials to form the collector contact. This structure is illustrated in FIG. 11.

After formation of the emitter and collector, the remaining TEOS layer 22 is then removed to expose the upper surface of the P+ poly layer 24 without removing the sidewall oxide layers 38 and 40. The exposed polysilicon is then silicided, resulting in a silicide layer 72 formed over the N+ region 64, a silicide layer 74 formed over the N+ region 66 and a silicide layer 76 formed over the P+ poly layer 24. The siliciding process is described in U.S. Pat. No. 4,545,116, which is incorporated herein by reference. Basically, metallic titanium is first applied over the substrate and then heated in a nitrogen atmosphere so that the titanium reacts with the exposed silicon surfaces to form titanium disilicide. The portions of the titanium that do not react to form silicides are then stripping (using for example, a wet etch). This process provides a self-aligned silicidation process without any patterning step which has come into wide use in integrated circuit fabrication. The silicided operation is also described in U.S. Pat. No. 4,657,628, filed Apr. 14, 1987, which is incorporated herein by reference.

After forming the silicided layers 72–76 as illustrated in FIG. 12, a conformal layer of TEOS 78 is deposited over the substrate to provide an isolation layer. The insulating layer 78 is then patterned to form an emitter contact opening 80 and a collector contact opening 82. A base contact is formed at one end of the device (not shown). Metal is then deposited over the substrate, patterned and etched to provide a collector contact 84 and an emitter contact 86. This allows the transistor formed thereby to be connected to other elements in an integrated circuit.

Referring now to FIG. 13, there is illustrated a top view of the transistor of FIG. 12 without the metal layers 84 and 86. The N-type tank 10 was formed within the isolation region 12 with boundaries 88. Therefore, transistor is formed within the boundaries 88. The original poly layer 22, which has the silicided layer 76 formed on the upper surface thereof, extends outward from this boundary and up over the isolating oxide layer 12. A base contact opening 90 is formed at one end thereof to allow contact by the metallization pattern how illustrated in FIG. 12.

In summary, there has been provided a method for fabricating a horizontal self-aligned transistor. The method includes a first step of forming a relatively narrow base contact with the silicon surface which is contacted on the upper surface by a wider conductor strip which extends outward from the transistor. The contact provides a reference edge. Thereafter, a spacing layer of oxide is formed on the wall to provide a second reference edge. A trench is formed in the substrate with the second reference edge defining one vertical wall of the trench. Dopant material is disposed adjacent the vertical wall in the trench and then laterally driven into the substrate to form the base of the transistor which is in contact with the base contact. Thereafter, the trenches are filled with N+ doped poly to form the base and emitter of the transistor.

Although the present invention has been disclosed and claimed herein, it should be understood that various changes, substitutions and alterations can be made therein without departing form the spirit and scope of the invention as defined by the appended claims.

What is claimed is:

1. A method for forming a horizontal transistor, comprising:
    forming an island of semiconductor material of one conductivity type over an insulating layer;
    forming a base contact on the surface of the semiconductor material to define an emitter region on one side and a collector region on the other side, the base contact having at least one essentially vertical edge on the emitter side thereof to provide a reference edge;
    forming a trench in the semiconductor material extending from the surface thereof to the insulating layer and having an essentially vertical wall spaced a predetermined distance from the reference edge;
    introducing impurities of a type opposite the semiconductor material into the trench and through the essentially vertical walls of the trench to a predetermined distance from the wall of the trench under the base contact to form a metallurgical junction on the collector side of the base contact;
    forming an emitter region of the same impurity type as the semiconductor material adjacent the essentially vertical wall of the trench; and
    forming an emitter contact to the emitter region and a collector contact to the semiconductor material on the collector side of the base contact.

2. The method of claim 1 wherein the step of forming the trench a predetermined distance from the reference edge comprises:
    forming a layer of sidewall oxide on the one essentially vertical edge of the base contact to a predetermined thickness to define a trench reference edge spaced away from the vertical wall of the base contact; and
    selectively patterning and etching the semiconductor material to form the trench and utilizing the second edge as a self-aligned mask to define the vertical wall of the trench proximate to the base contact.

3. The method of claim 2 wherein the step of forming the sidewall oxide comprises:
    depositing a conformal layer of oxide over the substrate after formation of the base contact; and
    anisotropically etching the oxide in a vertical direction downward to the surface of the substrate.

4. The method of claim 1 wherein the step of forming the base contact on the surface of the semiconductor material comprises:
    forming an insulating layer over the substrate;
    forming a layer of doped polycrystalline silicon on the surface of the insulating layer, the polycrystalline silicon layer doped with an impurity type opposite to that of the substrate;
    depositing a layer of masking material on the top surface of the polycrystalline silicon layer;
    patterning the insulating layer, doped polycrystalline silicon layer and masking layer and forming a stacked structure having a predetermined width with essentially vertical walls on either side of the stacked structure;
    selectively etching a portion of the insulating layer from the side thereof on at least one of the essentially vertical walls of the stacked structure to undercut the polysilicon layer by a predetermined distance to form an undercut region; and
    forming a filter of polycrystalline silicon in the undercut region to contact the substrate.

5. The method of claim 4 wherein the step at forming the filler comprises:
    depositing a conformal layer of polycrystalline silicon over the substrate and the stacked structure after undercutting of the polycrystalline silicon doped layer; and
    isotropically etching the polycrystalline silicon layer to the substrate such that the portion of the polycrystalline silicon layer in the undercut region remains.

6. The method of claim 1 wherein the step of introducing impurities into the trench comprises:
    masking all portions of the substrate except the vertical wall of the trench proximate to the base contact; and
    diffusing impurities of the opposite type into the vertical wall of the trench proximate to the base contact in the lateral direction to a predetermined distance.

7. The method of claim 6 and further comprising depositing a thin layer of polycrystalline silicon in the trench prior to diffusing impurities into the vertical wall of the trench such that the impurities of the opposite type are diffused through the thin layer of polycrystalline silicon.

8. The method of claim 1 wherein the step of forming the collector contact comprises:
    forming a trench in the semiconductor material on the collector side of the base contact extending from the surface of the semiconductor material to the insulating layer; and
    forming a layer of doped polycrystalline silicon into the trench of the same conductivity type as the semiconductor material.

9. The method of claim 1 wherein the step of introducing impurities into the trench forms a graded impurity profile to metallurgical junction from the wall of the trench.

10. A method for forming a horizontal transistor;
forming an island of semiconductor material of a first conductivity type on an insulating material, the island having a bottom surface and a parallel upper surface;
forming a base contact of a second conductivity type opposite the first conductivity type on the surface of the semiconductor material to define a collector region on one side thereof and an emitter region on the opposite side thereof, the base contact having an essentially vertical wall on the emitter side thereof to provide a first reference edge;
forming a layer of insulating material on the vertical wall of the base contact to a predetermined thickness, the outermost surface of the insulating layer providing a second reference edge;
forming a first trench on the emitter side of the transistor extending from the surface of the island of semiconductor material to the bottom surface thereof and having at least one essentially vertical wall self-aligned with the second reference edge;
forming a collector trench on the collector side of the base contact and spaced a predetermined distance therefrom and extending from the surface of the island of semiconductor material to the bottom thereof;
introducing impurities of the second conductivity type into the vertical wall of the emitter trench and driving the impurities laterally into the island of semiconductor material to form a metallurgical junction on the collector side of the base contact and having a graded impurity profile;
filling the emitter and collector trenches with a layer of polycrystalline silicon of the first conductivity type to form an emitter region and a collector contact, respectively; and
providing interconnections to the base contact, the emitter region and the collector contact.

11. The method of claim 10 wherein the step of forming the insulating layer on the essentially vertical wall of the base contact comprises:
depositing a conformal layer of oxide on the island of semiconductor material; and
anisotropically etching the layer of oxide to remove the oxide from all planar surface such that a predetermined thickness of oxide remains on all essentially vertical surfaces, the remaining portion of the oxide layer on the collector side of the base contact functional to isolate the collector trench from the base contact.

12. The method of claim 10 wherein the step of forming the base contact comprises:
forming a first layer of insulating material on the island of semiconductor material;
forming a layer of polycrystalline silicon on the surface of the insulating layer and doped with impurities of the second conductivity type;
forming a second layer of insulating material on the upper surface of the polycrystalline layer;
patterning and etching the first and second insulating layers and the polycrystalline silicon layer to define a stacked structure having an essentially vertical wall on the emitter side and an essentially vertical wall on the collector side;
selectively etching the sidewall of the first insulating layer on at least the emitter side of the stacked structure in a lateral direction to a predetermined distance from the vertical wall of the stacked structure to define an undercut region;
forming a conformal layer of polycrystalline silicon over the island of semiconductor material; and
isotropically etching the conformal layer of polycrystalline silicon such that polycrystalline silicon remains in the undercut region to contact the surface of the island of semiconductor material and the polycrystalline layer, the portion of the polycrystalline silicon layer remaining in the undercut region forming the base contact.

13. The method of claim 10 wherein the step of introducing impurities comprises:
forming a thin layer of polycrystalline silicon on the aligned vertical wall of the emitter trench;
diffusing impurities of the second conductivity type into the polycrystalline silicon layer; and
driving the impurities from the polycrystalline silicon layer on the vertical wall of the emitter trench into the substrate in a layer direction to a predetermined distance.

14. The method of claim 10 wherein the step of filling the emitter and collector trenches with a layer of doped material comprises:
depositing a first layer of polycrystalline silicon less than the depth of the trench over the island of semiconductor material;
diffusing impurity materials of the first conductivity type into the first layer of polycrystalline silicon;
depositing a second layer of polycrystalline silicon over the island of semiconductor material;
diffusing impurities into the second layer of polycrystalline silicon; and
planarizing the first and second layers of polycrystalline silicon such that polycrystalline silicon remains only in the trenches and is removed from the upper surface of the base contact and all essentially vertical surfaces.

15. A method for forming a horizontal transistor, comprising:
forming an island of semiconductor material of the first conductivity type over an insulating layer, the island having an upper surface and a coplanar bottom surface;
forming a stacked structure comprised of a first layer of insulating material adjacent the island of semiconductor material, a layer of doped polycrystalline silicon of a second conductivity type opposite to the first conductivity type and a second layer of insulating material, the stacked structure having two oppositely disposed essentially vertical walls, one vertical wall defining an emitter side of the transistor and one vertical wall defining the collector side of the transistor;
removing a portion of the first insulating layer on the vertical wall of the stacked structure on the emitter side to form an undercut region under the doped polycrystalline silicon layer in the stacked structure;
filling the undercut region with polycrystalline silicon to form a contact between the doped polycrystalline silicon stacked structure and the substrate, the filled portion forming the base contact with the surface of the semiconductor material;
forming a sidewall oxide layer on each of the vertical walls of the stacked structure, the outermost surface of the sidewall oxide on the emitter side of the stacked structure defining a reference edge;

forming a trench on both the emitter side of the stacked structure and the collector side of the stacked structure, the outermost surfaces of the sidewall oxide layers defining one vertical wall of the trenches, the emitter and collector trenches extending from the upper surface of the island of semiconductor material to the bottom surface thereof;

depositing a thin layer of polycrystalline silicon over the island of semiconductor material;

masking off the collector side of the transistor;

introducing impurities into the polycrystalline silicon layer in the emitter trench;

driving the impurities in the polycrystalline silicon layer into the vertical wall of the emitter trench aligned with the reference edge to form a metallurgical junction on the opposite side of the polycrystalline filler to form a collector-base metallurgical junction that has a graded impurity profile;

filling the emitter and collector trenches with a layer of doped polycrystalline silicon of the first conductivity type;

removing the second insulating layer in the stacked structure and forming silicide layers over the doped polycrystalline silicon layer in the stacked structure and the doped polycrystalline silicon layers in the emitter and collector trenches to form the base contact, emitter contact and collector contact, respectively; and forming interconnects with the base, collector and emitter contacts of the transistor to allow interconnection with remaining circuits.

* * * * *